(12) United States Patent
Kim et al.

(10) Patent No.: US 8,906,761 B2
(45) Date of Patent: Dec. 9, 2014

(54) METHOD OF MANUFACTURING FOR SEMICONDUCTOR DEVICE USING EXPANDABLE MATERIAL

(71) Applicant: Samsung Electronics Co., Ltd., Suwon-si (KR)

(72) Inventors: Shinhye Kim, Suwon-si (KR); Sangho Rha, Suwon-si (KR); Jeong-Kyu Lee, Incheon (KR); Zulkarnain, Yongin-si (KR); Kyungseok Oh, Seoul (KR); Sangbom Kang, Seoul (KR); Seungjae Lee, Hwaseong-si (KR); Jungchan Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/798,700

(22) Filed: Mar. 13, 2013

(65) Prior Publication Data

US 2014/0073125 A1 Mar. 13, 2014

(30) Foreign Application Priority Data

Sep. 10, 2012 (KR) ........................ 10-2012-0099927

(51) Int. Cl.
*H01L 29/739* (2006.01)
*H01L 29/66* (2006.01)
(52) U.S. Cl.
CPC ................................ *H01L 29/66666* (2013.01)
USPC ............................ 438/199; 438/275; 438/587

(58) Field of Classification Search
USPC .......................... 438/199, 275, 218–219, 587
See application file for complete search history.

(56) References Cited

U.S. PATENT DOCUMENTS

2007/0059899 A1 3/2007 Smythe, III et al.
2010/0025759 A1* 2/2010 Yoshimochi .................. 257/330

FOREIGN PATENT DOCUMENTS

| JP | 11-274286 | 10/1999 |
|---|---|---|
| KR | 10-1997-0053432 | 7/1997 |
| KR | 1019990076105 | 10/1999 |
| KR | 1020020003018 | 1/2002 |
| KR | 1020030009634 | 2/2003 |
| KR | 1020040037460 | 5/2004 |
| KR | 1020070000062 | 1/2007 |

* cited by examiner

Primary Examiner — Thanhha Pham
(74) Attorney, Agent, or Firm — Onello & Mello, LLP

(57) ABSTRACT

A semiconductor device is manufactured using an expandable material. The method includes forming a first gate insulating layer on a substrate, forming first and second gate structures on the first gate insulating layer, the first and second gate structures being spaced apart from each other at a distance, forming an expandable material on sidewalls and upper surfaces of the first and second gate structures, forming a gap-fill layer on the expandable material between the first and second gate structures, and performing a heat-treatment process to increase the volume of the expandable material.

19 Claims, 12 Drawing Sheets

METHOD OF MANUFACTURING FOR SEMICONDUCTOR DEVICE USING EXPANDABLE MATERIAL

CROSS-REFERENCE TO RELATED APPLICATIONS

This U.S. non-provisional patent application claims priority under 35 U.S.C. §119 to Korean Patent Application No. 10-2012-0099927, filed on Sep. 10, 2012, the entire contents of which are hereby incorporated by reference.

TECHNICAL FIELD

The disclosure herein relates to a method of manufacturing a semiconductor device using an expandable material and a gap-fill layer. The density of the gap-fill layer may be increased by a heat treatment process that is performed after forming the gap-fill layer.

BACKGROUND

An existing method of manufacturing a semiconductor device comprises forming a plurality of gate structures that are spaced apart from each other at a distance on a substrate and forming a gap-fill layer on and between the gate structures. When the gap-fill layer is formed on and between the gate structures, it is generally desired to reduce air gaps in the gap-fill layer. In order to reduce the air gaps, use of a gap-fill layer having a lower density and greater flowability is preferred. After forming the gap-fill layer, a contact hole is formed in the gap-fill layer. However, if the density of the gap-fill layer is low, the contact hole may have a bowing profile or a wide mouth profile. Therefore, an additional process is needed to increase the density of the gap-fill layer before forming the contact hole.

SUMMARY

The present disclosure provides a method of manufacturing a semiconductor device using an expandable material.

Embodiments of the inventive concepts provide a method of manufacturing a semiconductor device including forming a first gate insulating layer on a substrate; forming first and second gate structures on the first gate insulating layer, the first and second gate structures being spaced apart from each other at a distance; forming an expandable material on the sidewalls and upper surfaces of the first and second gate structures; forming a gap-fill layer on the expandable material and between the first and second gate structures; and performing a heat treatment process to increase the volume of the expandable material.

The expandable material may comprise a polysilicon layer.

The polysilicon layer may have a thickness range of 10 to 100 Å.

The polysilicon layer is transformed into a silicon dioxide layer during the heat treatment process.

The heat treatment process may have a temperature range of 400 to 700° C. and a pressure range of 10 to 30 atm.

The heat treatment process may be performed by using oxygen ($O_2$) and/or water vapor ($H_2O$).

The gap-fill layer may be densified by the heat treatment process, increasing the volume of the expandable material.

The gap-fill layer may be formed by a spin-on-glass (SOG) process, a chemical-vapor-deposition (CVD) process, and/or an atomic-layer-deposition (ALD) process.

The method may further comprise forming a sidewall spacer on the sidewalls of the first and second gate structures before forming the expandable material.

The sidewall spacer may comprise a silicon dioxide layer, a silicon nitride layer, and/or a silicon oxynitride layer.

The method of forming the first and second gate structures may comprise forming a first and second conductive layer on the first gate insulating layer and forming a hard mask layer on the first and second conductive layer.

The conductive layer may comprise polysilicon, tungsten silicide ($WSi_x$), tungsten (W), tungsten nitride (WN), titanium (Ti), and/or titanium nitride (TiN).

The hard mask layer may comprise a silicon dioxide layer, a silicon nitride layer, and/or a silicon oxynitride layer.

The method may further comprise planarizing the gap-fill layer to expose upper surfaces of the first and second gate structures after performing the heat treatment process; removing the first and second gate structures and the first and second gate insulating layer to form recess regions; forming a second gate insulating layer at bottoms of the recess regions; and forming gate electrodes in the recess regions, wherein the gate electrodes comprise titanium (Ti), titanium nitride (TiN), tantalum (Ta), tantalum nitride (TaN), tungsten (W), copper (Cu), and/or aluminum (Al).

The second gate insulating layer including hafnium (Hf) and/or zirconium (Zr).

The method may further comprise forming an initial oxide layer at the bottoms of the recess regions before forming the second gate insulating layer. The initial oxide layer may have a thickness of less than 30 Å.

In other embodiments of the inventive concepts, a semiconductor device is manufactured by forming a first gate insulating layer on a substrate. First and second gate structures are then formed on the first gate insulating layer, wherein the first and second gate structures having exposed surfaces and being spaced apart from each other at a distance. The exposed surfaces of the first and second gate structures are coated with a polysilicon layer; and a gap-fill layer is formed on the polysilicon layer between the first and second gate structures. Finally, the polysilicon layer is heated while exposed to a reactant to produce an expanded product layer having a volume greater than the volume of the polysilicon layer.

In accordance with particular embodiments of this method, the reactant may comprise oxygen, which may be provided in the form of $O_2$ or water vapor. The resulting product layer may comprise silicon dioxide.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF EMBODIMENTS

Figure 1:
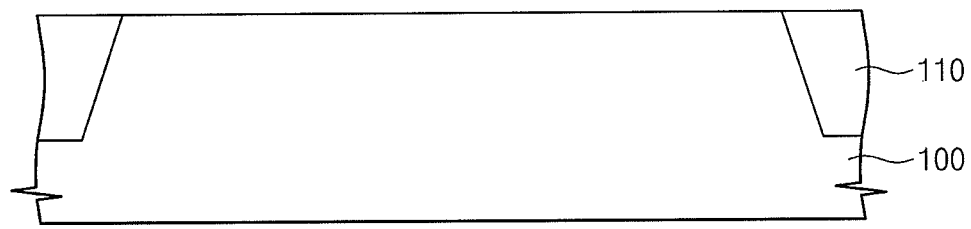
FIGS. 1 through 7 are cross-sectional views illustrating a method of manufacturing a semiconductor device according to an embodiment of the inventive concept.

Exemplary embodiments of the inventive concept will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the inventive concepts to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the exemplary embodiments and is not a limitation on the scope of the inventive concepts unless otherwise specified.

Embodiments will be described with reference to perspective views, cross-sectional views, and/or plan views. The profile of an exemplary view may be modified according to, e.g., manufacturing techniques and/or allowances. Accordingly, the exemplary embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Hereinafter, exemplary embodiments of the inventive concept will be described in detail with reference to the accompanying drawings.

FIG. 1 through FIG. 7 are cross-sectional views illustrating a method of manufacturing a semiconductor device according to an embodiment of the inventive concepts.

Referring to FIG. 1, a substrate 100 may be provided. The substrate 100 may comprise a rigid substrate, such as a bulk silicon substrate, a silicon-on-insulator (SOI) substrate, a gallium-arsenide substrate, a silicon-germanium substrate, a ceramic substrate, a quartz substrate, a glass substrate for display, or a flexible plastic substrate formed of, e.g., polyethylene terephthalate, polymethylmethacrylate, polyimide, polycarbonate, polyethersulfone, or polyethylene naphthalate. The substrate may include a device isolation region 110. The device isolation region 110 may be formed by a shallow trench isolation (STI) process.

Figure 2:
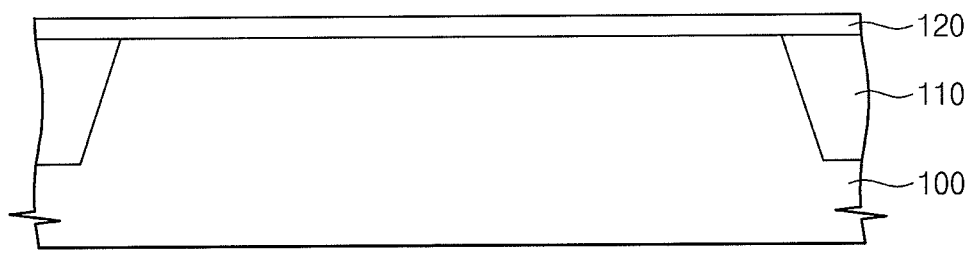

Referring to FIG. 2, a gate insulating layer 120 may be formed on the substrate 100. The gate insulating layer 120 may be formed of a silicon dioxide which is formed by at least one of a thermal oxidation process, a radical-oxidation process, or an atomic-layer-deposition (ALD) process. The radical-oxidation process may be performed using oxygen ($O_2$) and hydrogen ($H_2$). The gate insulating layer may have a thickness of less than 30 Å.

Figure 3:
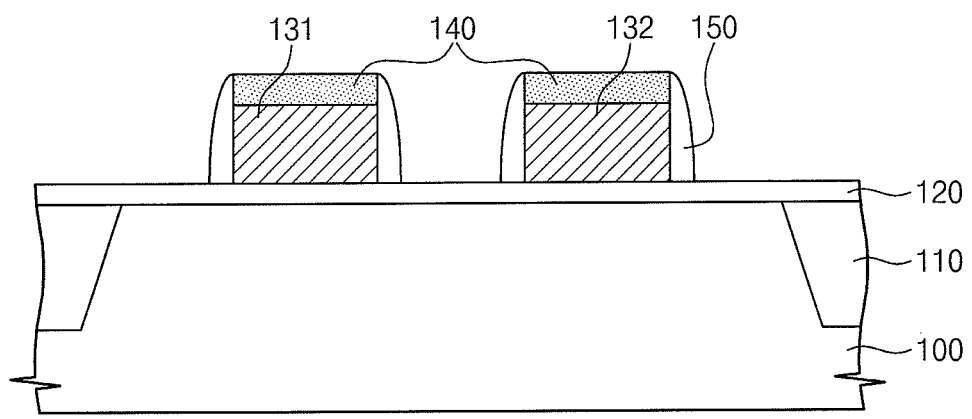

Referring to FIG. 3, first and second gate electrodes 131 and 132 may be formed on the gate insulating layer 120. The first and second gate electrodes 131 and 132 may be formed of a polysilicon (polycrystalline silicon) layer, a tungsten-silicide ($WSi_x$) layer, a tungsten (W) layer, a tungsten-nitride (WN) layer, a titanium (Ti) layer, and/or a titanium-nitride (TiN) layer. The first and second gate electrodes 131 and 132 are spaced apart from each other at a distance. A hard mask layer 140 may be formed on the first and second gate electrodes 131 and 132. The hard mask layer 140 may be used as an etching stop layer when the first and second gate electrodes 131 and 132 are formed by an etching process. The hard mask layer 140 may be formed of a silicon-dioxide layer, a silicon-nitride layer or a silicon-oxynitride layer. A combined structure of the first gate electrode 131 and the hard mask layer 140 may be called a first gate structure, and a combined structure of the second gate electrode 132 and the hard mask layer 140 may be called a second gate structure. A sidewall spacer 150 may be formed on sidewalls of the first and second gate electrodes 131 and 132. The sidewall spacer 150 may be extended on a sidewall of the hard mask layer 140. The sidewall spacer 150 may be formed of at least one of a silicon dioxide layer, a silicon nitride layer, or a silicon oxynitride layer. The sidewall spacer 150 may have a different etch rate comparing to the hard mask 140.

Figure 4:
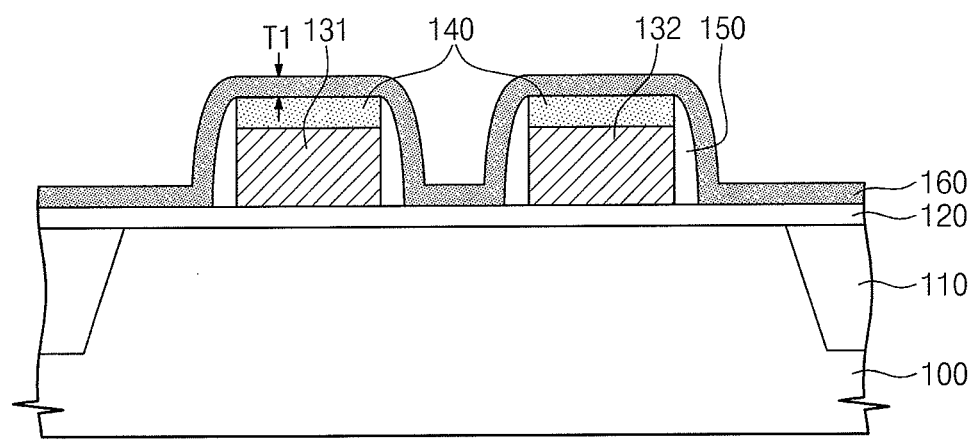

Referring to FIG. 4, an expandable material 160 may be formed on a sidewall of the sidewall spacer 150 and an upper surface of the hard mask layer 140. The expandable material 160 may have a thickness of 10 to 100 Å and may be formed of a polysilicon layer.

Figure 5:
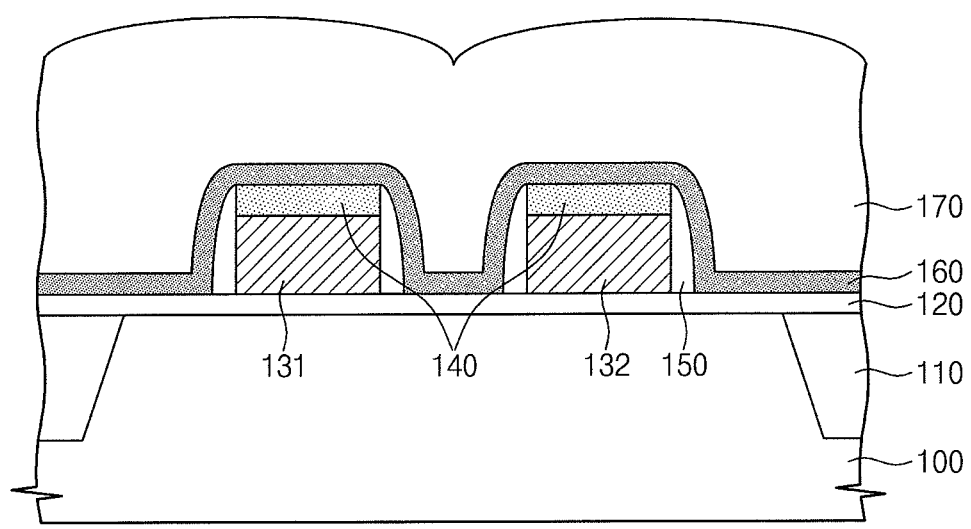

Referring to FIG. 5, a gap-fill layer 170 may be formed on the expandable material 160 and between the first and second gate electrodes 131 and 132. The gap-fill layer 170 may be formed of a silicon-oxide layer that is formed by at least one of a spin-on-glass (SOG) process, a chemical-vapor-deposition (CVD) process, a flowable-chemical-vapor-deposition (FCVD) process, or an atomic-layer-deposition (ALD) process.

Figure 6:
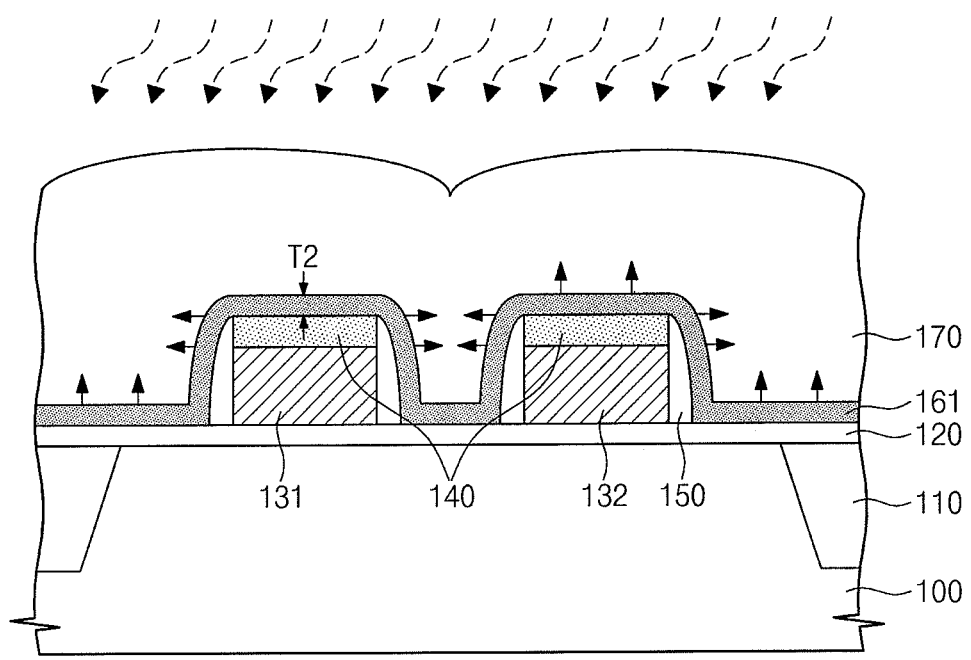

Referring to FIG. 6, a heat-treatment process 180 may be performed by using oxygen ($O_2$) and/or water vapor ($H_2O$).

The heat-treatment process 180 may be performed in a temperature range of 400 to 700° C. and in a pressure range of 10 to 30 atm. If the expandable material 160 is a polysilicon layer, it may be transformed into a silicon-dioxide layer 161 after the heat-treatment process 180. At this moment, the volume of the expandable material 160 may be increased to about double its previous size. In other words, an expandable material 160 having a thickness T1 (shown in FIG. 4) may be converted to form silicon dioxide having a thickness T2 (shown in FIG. 6), which is about double T1.

Generally, a gap-fill material, which is formed by a spin-on-glass process or a CVD process, may be densified by a heat-treatment process 180. However, in the present inventive concepts, the gap-fill layer 170 especially formed between the first and second gate electrodes may be further densified by volume expansion of the expandable material 160.

Figure 7:
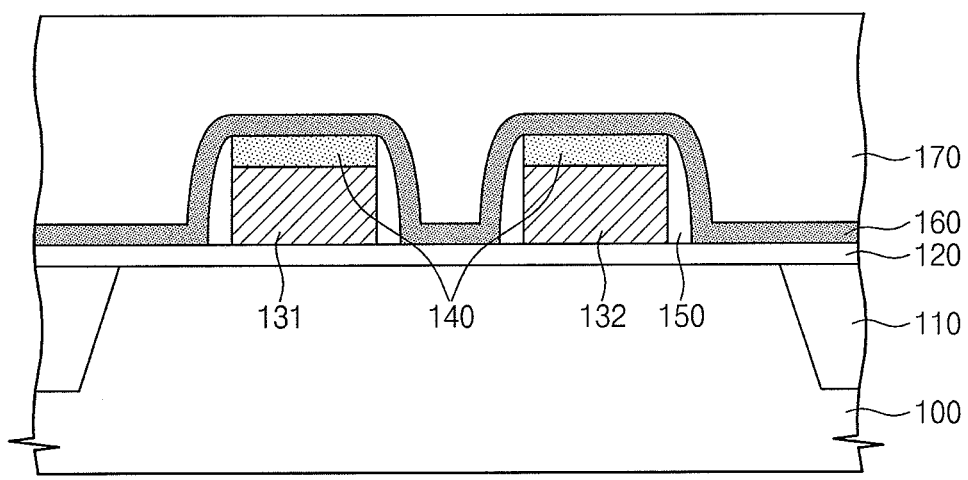

Referring to FIG. 7, the gap-fill layer 170 may be planarized by a chemical-mechanical polishing (CMP) process or by an etch-back process.

Additionally, source/drain regions of transistors may be formed on the substrate. Contact holes and metal-interconnection lines may also be formed for applying a voltage to the source/drain regions and gate electrodes. At this moment, if the gap-fill layer 170 was densified through the heat-treatment process 180 before forming the contact holes, the the contact holes would have a more vertical shape—for example, without or with less of a bowing or wide-mouth profile.

Figure 8:
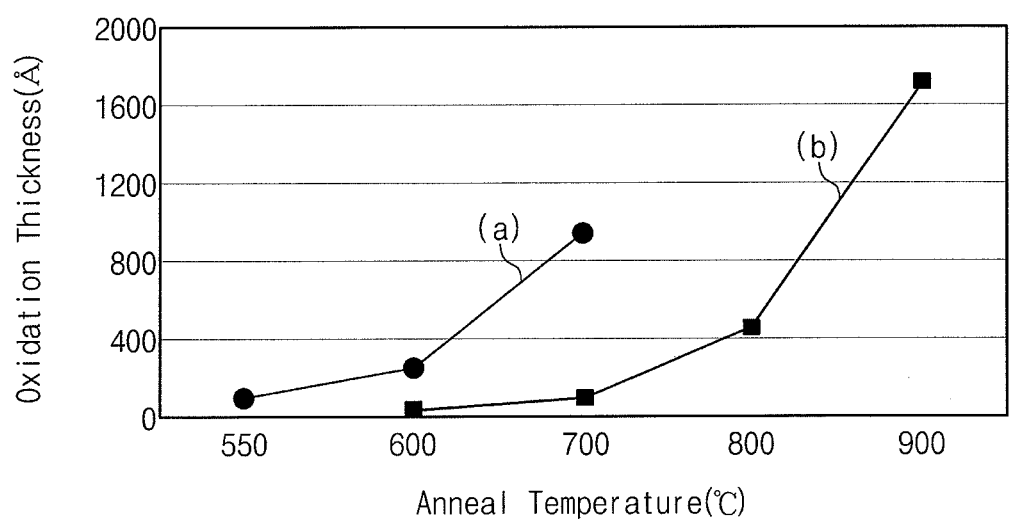
FIG. 8 is a graph comparing oxidation amounts of polysilicon layers in different conditions of an atmospheric pressure (b) and a high pressure (a), more specifically, in different conditions of 1 atm and 25 atm according to an embodiment of the inventive concept.

FIG. 8 is a graph comparing oxidation amounts of polysilicon layers in different conditions at an atmospheric pressure (b) and at a high pressure (a).

FIG. 8 verifies that an oxidation amount of a polysilicon layer obtained at 25 atm, which is a high pressure range, and at 600° C. is almost the same as the oxidation amount obtained at 1 atm, which is atmospheric pressure, and at 740° C. In other words, if the heat-treatment process 180 is performed at 25 atm, the temperature of the heat-treatment process 180 may be reduced about 140° C. from the temperature of the heat-treatment process 180 performed at atmospheric pressure (1 atm).

Therefore, if the heat-treatment process 180 is performed at a high pressure and at a low temperature, deterioration of the electrical characteristics of a transistor may be prevented by reducing lateral diffusion of ions that were implanted to the source/drain regions. In order to reduce the temperature of the heat-treatment process 180, the heat-treatment process 180 can be performed at a high-pressure range of 10 to 30 atm.

FIGS. 9 through 18 are cross-sectional views illustrating a method of manufacturing a semiconductor device according to another embodiment of the inventive concepts.

Figure 9:
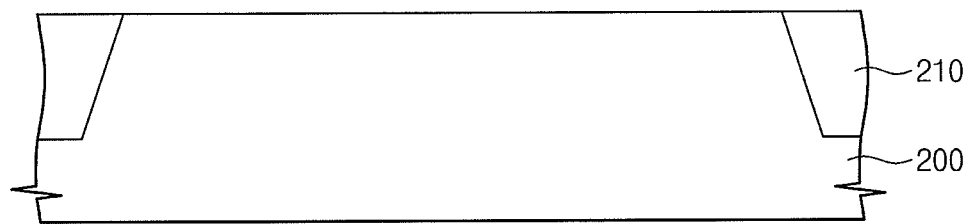
FIGS. 9 through 18 are cross-sectional views illustrating a method of manufacturing a semiconductor device according to another embodiment of the inventive concept.

Referring to FIG. 9, a substrate 200 may be provided. The substrate 200 may comprise a rigid substrate, such as a bulk silicon substrate, a silicon-on-insulator (SOI) substrate, a gallium-arsenide substrate, a silicon-germanium substrate, a ceramic substrate, a quartz substrate, a glass substrate for display, or a flexible plastic substrate formed of, e.g., a polyethylene terephthalate, a polymethylmethacrylate, a polyimide, a polycarbonate, a polyethersulfone, or a polyethylene naphthalate. The substrate may include a device isolation region 210. The device isolation region may be formed by a shallow-trench isolation (STI) process.

Figure 10:
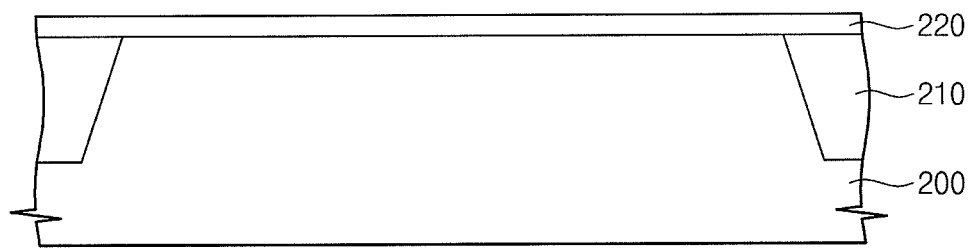

Referring to FIG. 10, a first gate insulating layer 220 may be formed on the substrate 200. The first gate insulating layer 220 may be formed of silicon dioxide by using a thermal oxidation process, a CVD process, or an ALD process.

Figure 11:
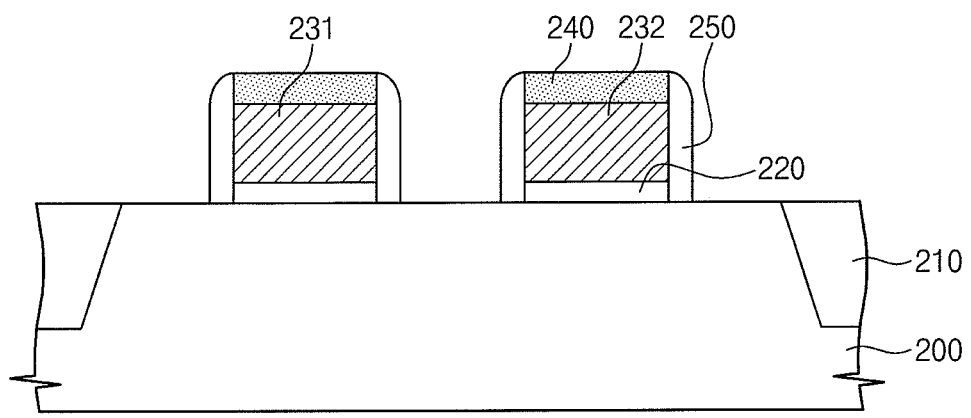

Referring to FIG. 11, first and second dummy gate patterns 231 and 232 may be formed on the first gate insulating layer 220. The first and second dummy gate patterns 231 and 232 may be formed of a polysilicon layer. The first and second dummy gate patterns 231 and 232 are spaced apart from each other at a distance. A hard mask layer 240 may be formed on the first and second dummy gate patterns 231 and 232. The hard mask layer 240 may be used as an etching stop layer when the first and second dummy gate patterns 231 and 232 are formed by an etching process. The hard mask layer 240 may be formed of silicon dioxide, silicon nitride, or silicon oxynitride. A combined structure of the first dummy gate pattern 231 and the hard mask layer 240 may be called a first gate structure, and a combined structure of the second dummy gate pattern 232 and the hard mask layer 240 may be called a second gate structure. A sidewall spacer 250 may be formed on sidewalls of the first and second gate electrodes 231 and 232. The sidewall spacer 150 may be extended on a sidewall of the hard mask layer 240 and may be formed of a silicon-dioxide layer, a silicon-nitride layer, and/or a silicon-oxynitride layer. The sidewall spacer 250 may have a different etch rate compared to the hard mask 240.

Figure 12:
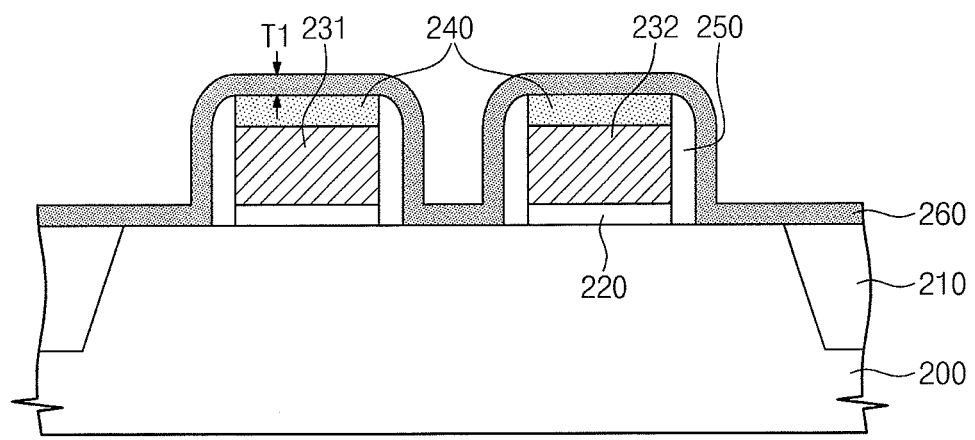

Referring to FIG. 12, an expandable material 260 may be formed on a sidewall of the sidewall spacer 250 and on an upper surface of the hard mask layer 240. The expandable material 260 may have a thickness of 10 to 100 Å and may be formed of a polysilicon layer.

Figure 13:
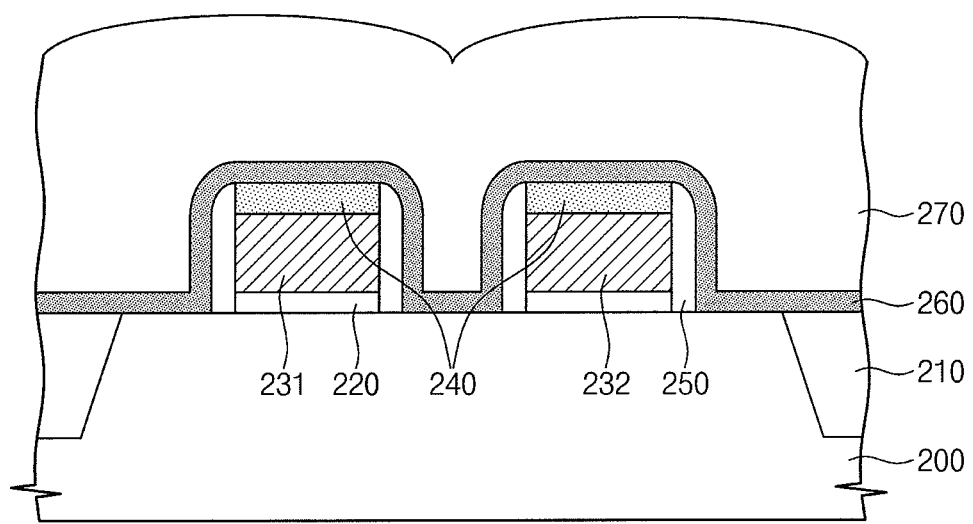

Referring to FIG. 13, a gap-fill layer 270 may be formed on the expandable material 260 between the first and second dummy gate patterns 231 and 232. The gap-fill layer 270 may be formed of silicon dioxide by using a SOG process, a CVD process, a FCVD process, and/or an ALD process.

Figure 14:
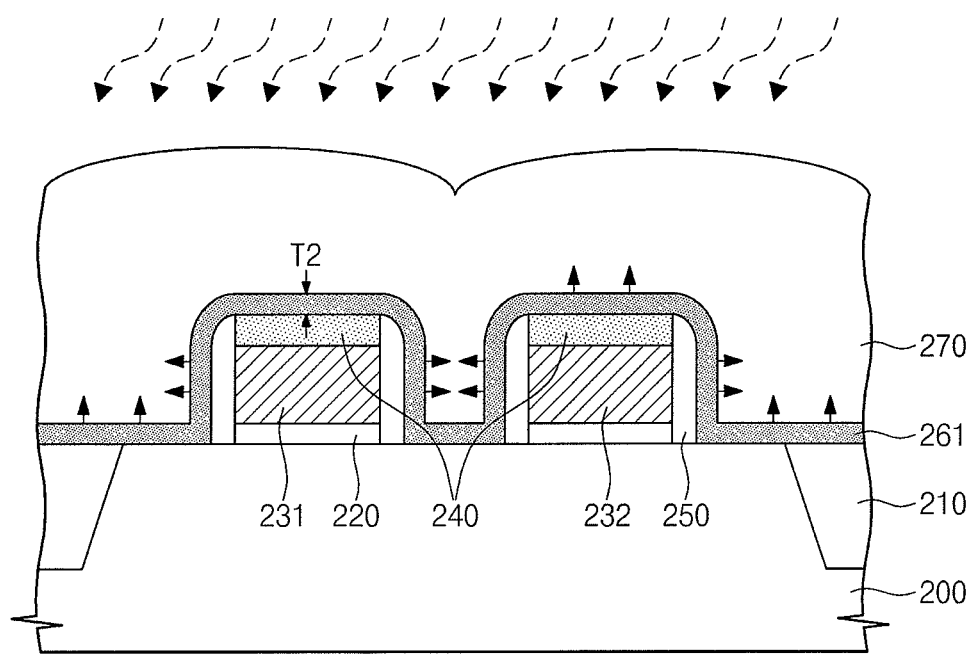

Referring to FIG. 14, a heat-treatment process 280 may be performed by using at least one selected from oxygen ($O_2$) and/or water vapor ($H_2O$). The heat-treatment process 280 may be performed in a temperature range of 400 to 700° C. and a pressure range of 10 to 30 atm. If the expandable material 260 is formed of a polysilicon layer, the expandable material 260 may be transformed into a silicon-dioxide layer 261 after the heat-treatment process 280. At this moment, the volume of the expandable material 260 may be doubled. In other words, the expandable material 260 having a thickness T1 (shown in FIG. 12) may become a silicon dioxide layer having a thickness T2 (shown in FIG. 14), which is about double the thickness of T1.

Generally, a gap-fill material, which is formed by a SOG process or by a CVD process, may be densified by a heat-treatment process 280. However, in the present inventive concepts, the gap-fill layer 270 especially formed between the first and second gate electrodes may be further densified by expansion of the expandable material 260.

Figure 15:
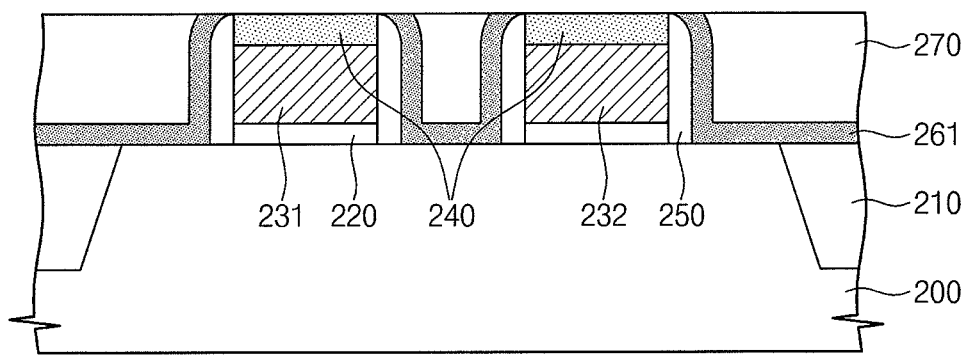

Referring to FIG. 15, the gap-fill layer 270 may be planarized by a chemical-mechanical-polishing (CMP) process or an etch-back process until an upper surface of the hard mask layer 240 is exposed.

Figure 16:
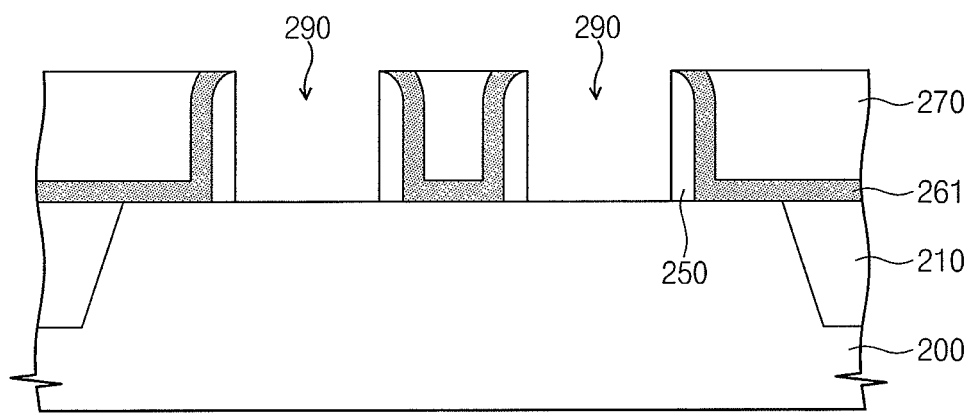

Referring to FIG. 16, recess regions 290 may be formed by removing the hard mask layer 240, the first and second dummy gate patterns 231 and 232, and the first gate insulating layer 220. In this case, the first gate insulating layer 220 may be called a sacrificial insulating layer. The recess regions 290 may expose an upper surface of the substrate 200. If the hark mask layer 240 is formed of a silicon-nitride layer, the hard mask layer 240 may be removed by using a phosphoric acid ($H_3PO_4$). The first and second dummy gate patterns 231 and 232 may be removed by using a dry or wet etching process. Hydrogen (H), bromine (Br), or chlorine (Cl) may be used for the dry etching process. The first gate insulating layer 220 may also be removed by using a dry or wet etching process.

Figure 17:
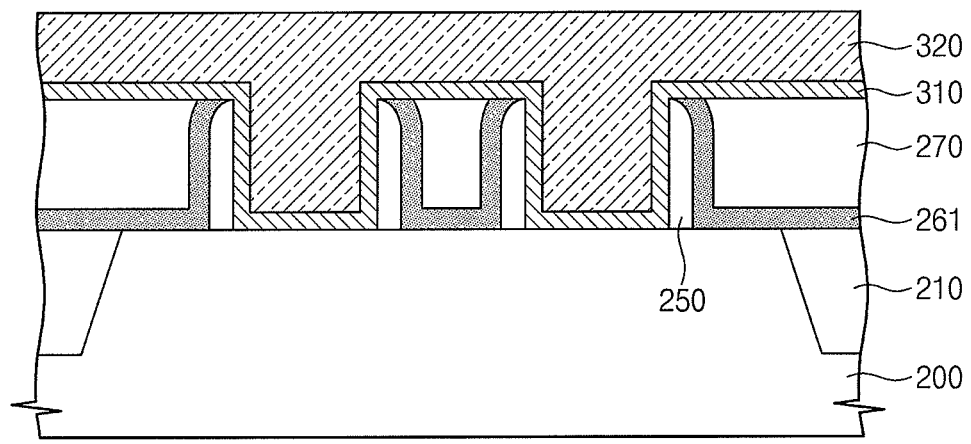
Figure 18:
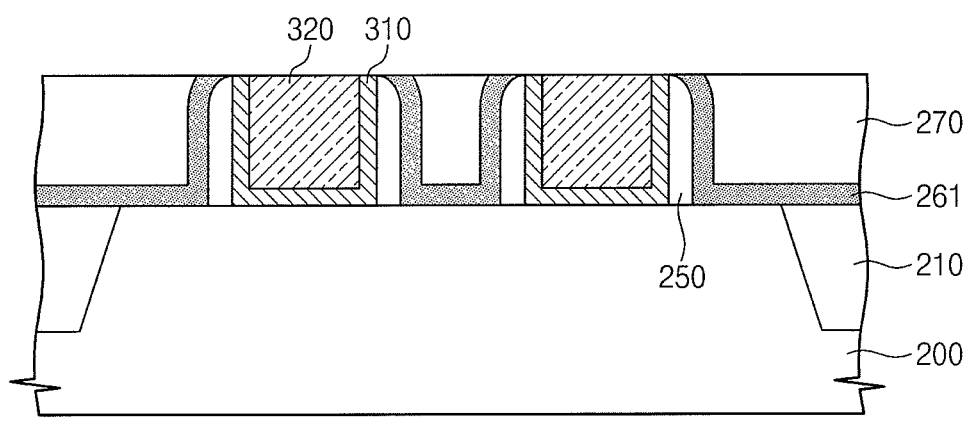

Referring to FIGS. 17 and 18, a second gate insulating layer 310 may be formed on the upper surface of the substrate 200, which is exposed at a bottom of the recess regions 290. The second gate insulating layer 310 may be extended on sidewalls of the recess regions 290 and upper surface of the gap-fill layer 270. The second gate insulating layer 310 may be formed of a high-k dielectric layer (for example, a hafnium-oxide layer or a zirconium-oxide layer). An initial oxide layer may be formed on the upper surface of the substrate 200 before forming the second gate insulating layer 310. A gate electrode 320 may be formed on the second gate insulating layer 310 and may fill the recess regions. The gate electrode 320 may comprise titanium (Ti), titanium nitride (TiN), tantalum (Ta), tantalum nitride (TaN), tungsten (W), copper (Cu), and/or aluminum (Al). The gate electrode 320 may be planarized by a chemical-mechanical-polishing (CMP) process or by an etch-back process until an upper surface of the gap-fill layer 270 is exposed.

Additionally, source/drain regions of transistors may be formed on the substrate 200. Contact holes and metal-interconnection lines may also be formed for applying a voltage to the source/drain regions and gate electrodes. At this moment, if the gap-fill layer 270 was densified through the heat-treatment process 280 before forming the contact holes, the contact holes would be more vertically shaped, for example, without or with less of a bowing or wide-mouth profile.

The above-disclosed subject matter is to be considered illustrative and not restrictive, and the appended claims are intended to cover all such modifications, enhancements, and other embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A method of manufacturing a semiconductor device, the method comprising:
   forming a first gate insulating layer on a substrate;
   forming first and second gate structures on the first gate insulating layer, the first and second gate structures having sidewalls and upper surfaces and being spaced apart from each other at a distance;
   forming an expandable material on the sidewalls and upper surfaces of the first and second gate structures;
   forming a gap-fill layer on the expandable material and between the first and second gate structures; and
   performing a heat-treatment process, wherein the gap-fill layer is densified by the heat-treatment process, increasing the volume of the expandable material.

2. The method as claimed in claim 1, wherein the expandable material comprises a polysilicon layer.

3. The method as claimed in claim 2, wherein the polysilicon layer has a thickness range of 10 to 100 Å.

4. The method as claimed in claim 2, wherein the polysilicon layer is transformed into a silicon-dioxide layer during the heat-treatment process.

5. The method as claimed in claim 4, wherein the heat-treatment process is performed at a temperature range of 400 to 700° C. and at a pressure range of 10 to 30 atm.

6. The method as claimed in claim 5, wherein the heat-treatment process is performed by using at least one gas selected from oxygen ($O_2$) and water vapor ($H_2O$).

7. The method as claimed in claim 1, wherein the gap-fill layer is formed by at least one process selected from a spin-on-glass process, a chemical-vapor-deposition process, and an atomic-layer-deposition process.

8. The method as claimed in claim 1, further comprising forming a sidewall spacer on sidewalls of the first and second gate structures before forming the expandable material.

9. The method as claimed in claim 8, wherein the sidewall spacer comprises at least one layer selected from a silicon-dioxide layer, a silicon-nitride layer, and a silicon-oxynitride layer.

10. The method as claimed in claim 1, further comprising:
    planarizing the gap-fill layer to expose upper surfaces of the first and second gate structures after performing the heat-treatment process;
    removing the first and second gate structures and the first gate insulating layer to form recess regions;
    forming a second gate insulating layer at bottoms of the recess regions;
    forming a gate electrode in the recess regions; and
    wherein the gate electrode comprises at least one composition selected from titanium (Ti), titanium nitride (TiN), tantalum (Ta), tantalum nitride (TaN), tungsten (W), copper (Cu), and aluminum (Al).

11. The method as claimed in claim 10, wherein the second gate insulating layer includes at least one composition selected from hafnium (Hf) and zirconium (Zr).

12. The method as claimed in claim 10, further comprising forming an initial oxide layer at the bottoms of the recess regions before forming the second gate insulating layer, the initial oxide layer having a thickness of less than 30 Å.

13. A method of manufacturing a semiconductor device, the method comprising:
    forming a first gate insulating layer on a substrate;
    forming first and second gate structures on the first gate insulating layer, the first and second gate structures having sidewalls and upper surfaces and being spaced apart from each other at a distance, wherein forming the first and second gate structures comprises:
      forming first and second conductive layers on the first gate insulating layer; and
      forming a hard mask layer on the first and second conductive layers;
    forming an expandable material on the sidewalls and upper surfaces of the first and second gate structures;
    forming a gap-fill layer on the expandable material and between the first and second gate structures; and
    performing a heat-treatment process to increase the volume of the expandable material.

14. The method as claimed in claim 13, wherein the conductive layer comprises at least one composition selected from polysilicon, tungsten silicide ($WSi_x$), tungsten (W), tungsten nitride (WN), titanium (Ti), and titanium nitride (TiN).

15. The method as claimed in claim 13, wherein the hard mask layer comprises at least one layer selected from a silicon-dioxide layer, a silicon-nitride layer, and a silicon-oxynitride layer.

16. A method of manufacturing a semiconductor device, the method comprising:
    forming a first gate insulating layer on a substrate;
    forming first and second gate structures on the first gate insulating layer, the first and second gate structures having exposed surfaces and being spaced apart from each other at a distance;
    forming a polysilicon layer on the exposed surfaces of the first and second gate structures;
    forming a gap-fill layer on the polysilicon layer and between the first and second gate structures; and heating the polysilicon layer while exposed to a reactant to produce an expanded product layer having a volume greater than the volume of the polysilicon layer.

17. The method of claim 16, wherein the reactant comprises oxygen.

18. The method of claim 17, wherein the oxygen is provided in the form of $O_2$ or water vapor.

19. The method of claim 17, wherein the product layer comprises silicon dioxide.

* * * * *